(12) United States Patent
Gotou

(10) Patent No.: US 8,018,153 B2
(45) Date of Patent: Sep. 13, 2011

(54) ELECTROLUMINESCENT ELEMENT HAVING A LAMINATION IMPACT ALLEVIATING LAYER

(75) Inventor: Mariko Gotou, Tokyo (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 1317 days.

(21) Appl. No.: 10/320,047

(22) Filed: Dec. 16, 2002

(65) Prior Publication Data

US 2003/0113581 A1 Jun. 19, 2003

(30) Foreign Application Priority Data

Dec. 14, 2001 (JP) .................................. 2001-381941

(51) Int. Cl.
*H05B 33/04* (2006.01)

(52) U.S. Cl. .......... 313/512; 313/511; 313/504; 445/25; 428/690

(58) Field of Classification Search .......... 313/500–512; 445/24–25; 428/690

See application file for complete search history.

(56) References Cited

U.S. PATENT DOCUMENTS

| | | | | |
|---|---|---|---|---|
| 5,124,204 A | * | 6/1992 | Yamashita et al. | 428/331 |
| 5,189,405 A | * | 2/1993 | Yamashita et al. | 313/512 |
| 5,477,053 A | * | 12/1995 | Umemoto et al. | 250/483.1 |
| 5,693,956 A | * | 12/1997 | Shi et al. | 257/40 |
| 5,757,126 A | * | 5/1998 | Harvey et al. | 313/506 |
| 5,811,177 A | * | 9/1998 | Shi et al. | 428/209 |
| 6,150,187 A | * | 11/2000 | Zyung et al. | 438/26 |
| 6,195,142 B1 | * | 2/2001 | Gyotoku et al. | 349/69 |
| 6,198,217 B1 | * | 3/2001 | Suzuki et al. | 313/504 |
| 6,450,635 B1 | * | 9/2002 | Okabe et al. | 347/106 |
| 6,677,620 B2 | * | 1/2004 | Ishii et al. | 257/100 |
| 6,720,203 B2 | * | 4/2004 | Carcia et al. | 438/99 |
| 6,815,887 B2 | * | 11/2004 | Lee et al. | 313/512 |

FOREIGN PATENT DOCUMENTS

| | | |
|---|---|---|
| JP | 08-236271 | 9/1996 |
| JP | 11-040344 | 2/1999 |
| JP | 2001-185348 | 7/2001 |

\* cited by examiner

*Primary Examiner* — Nimeshkumar Patel
*Assistant Examiner* — Mary Ellen Bowman
(74) *Attorney, Agent, or Firm* — Ladas & Parry LLP

(57) ABSTRACT

The present invention provides an electroluminescent element, including: a substrate; a first electrode layer formed on a surface of the substrate; an organic electroluminescent layer formed on the first electrode layer, the organic electroluminescent layer including at least a luminescent layer; a second electrode layer formed such that the organic electroluminescent layer is interposed between the first electrode layer and the second electrode layer, and a sealing base material for sealing the first electrode layer, the organic electroluminescent layer and the second electrode layer, wherein the sealing base material is a flexible film and a lamination impact alleviating layer of which universal hardness value is no smaller than 110 N/nm² is formed on the second electrode layer; when a flexible film is used as the sealing base material and the flexible film is laminated with the substrate at a predetermined pressure, the organic electroluminescent layer is prevented from being scratched or cracked, thus, an EL element which effects even luminescence can reliably be obtained.

12 Claims, 1 Drawing Sheet

ELECTROLUMINESCENT ELEMENT HAVING A LAMINATION IMPACT ALLEVIATING LAYER

BACKGROUND OF THE INVENTION

1. Field of the Invention

The present invention relates to an electroluminescent (the term "electroluminescent" will occasionally be referred to as "EL" hereinafter) element sealed by using a flexible film as a sealing base material.

2. Description of the Related Art

In recent years, Flat-Panel-Display (FPD) has increasingly been employed as a display which replaces CRT (Cathode-Ray-Tube) display which occupies a large space and has a relatively large weight. Examples of FPD include Liquid-Crystal-Display (LCD) which is widely and generally used as a display of various types of portable electronic appliances, a laptop-type personal computer and a small TV set. FPD of a type other than LCD, such as Plasma-Display-Panel (PDP), has also been generally employed.

Examples of FPD of a type other than LCD also include EL display. Although EL display has been studied for a relatively long timer EL display has not so widely been used due to problems of the difficulty in making EL display full-color and the relatively short product life.

Further, a film of an inorganic compound has conventionally been used as a luminescent layer of an EL element which constitutes EL display. However, an EL element using a film of an inorganic compound requires a relatively high driving voltage and exhibits a relatively low light-emission efficiency, thereby allowing only a display having low brilliance. On the other hand, in recent years, there has been used an EL element which employs, as a luminescent layer thereof, an film of an organic compound of which driving voltage is relatively low and light-emission efficiency is relatively high. In the case of an organic EL element using a film of an organic compound (an organic electroluminescent element), there has been a problem that the product life thereof is relatively short. However, as a result of the development of a material for an organic luminescent layer which enables prolonging the product life of an organic EL element, it is now possible to develop an organic EL element for practical use which can sufficiently compete with LCD.

Further, in recent years, there has increasing been a demand for an EL element having a thinner film, i.e., being more flexible. In order to meet such a demand, there has been proposed a method of using a flexible film as a sealing base material and laminating the sealing base material with a substrate under a predetermined pressure (the verb "laminate" will occasionally indicate this specific laminating process hereinafter"), thereby producing an EL element.

However, when an EL element is produced in such a laminating manner, as the strength of the organic EL layer is not so high, the organic EL layer is easily scratched or cracked by a slight impact or stress generated during the lamination process, whereby there arises a problem that the organic EL layer may fail to effect even luminescence.

SUMMARY OF THE INVENTION

The present invention has been achieved in consideration of the above-mentioned problems. The main object of the present invention is to provide an EL element which employs a flexible film as a sealing base material, whereby, when the sealing base material is laminated with the substrate at a predetermined pressure, the organic EL layer is neither scratched nor cracked and even luminescence can reliably be obtained.

In order to achieve the above-mentioned object, the present invention provides an electroluminescent (EL) element, comprising: a substrate; a first electrode layer formed on a surface of the substrate; an organic EL layer formed on the first electrode layer, the organic EL layer including at least a luminescent layer; a second electrode layer formed such that the organic EL layer is interposed between the first electrode layer and the second electrode layer, and a sealing base material for sealing the first electrode layer, the organic EL layer and the second electrode layer, wherein the sealing base material is a flexible film and a lamination impact alleviating layer of which universal hardness value is no smaller than 110 N/mm$^2$ is formed on the second electrode layer.

In the above invention, a lamination impact alleviating layer having such high hardness as described above is formed on a second electrode layer. Accordingly, when a flexible film is laminated with a substrate at a predetermined pressure for sealing, if some stress is applied by a pressing member at the time lamination, the lamination impact alleviating layer alleviates the stress, whereby the organic EL layer can be prevented from being scratched or cracked. Thus, an EL element which effects even luminescence can reliably be obtained.

The present invention provides an electroluminescent (EL) element, comprising: a substrate; a first electrode layer formed on a surface of the substrate; an organic EL layer formed on the first electrode layer, the organic EL layer including at least a luminescent layer; a second electrode layer formed such that the organic EL layer is interposed between the first electrode layer and the second electrode layer; and a sealing base material for sealing the first electrode layer, the organic EL layer and the second electrode layer, wherein the substrate and the sealing base material are flexible films, respectively, and a lamination impact alleviating layer is formed on the second electrode layer.

In the above present invention, both of a substrate and a sealing base material are made of a film material and a lamination impact alleviating layer is formed on a second electrode layer. Accordingly, even if some impact and/or stress is applied by a pressing member at the time lamination, the lamination impact alleviating layer alleviates the impact and stress, whereby the organic EL layer can be prevented from being scratched or cracked. Thus, a possibility that any inconvenience such as emission failure occurs can be significantly reduced.

The lamination impact alleviating layer of the aforementioned invention preferably has universal hardness value of no smaller than 110 N/mm$^2$. When the lamination impact alleviating layer is a member having such hardness as described above, the stress applied by a pressing member at the time of lamination, in particular, can be well blocked, whereby the effect of reducing scratches and crack generation in an organic EL layer is enhanced.

The aforementioned lamination impact alleviating layer has film thickness which is preferably no thinner than 0.6 µm. When the lamination impact alleviating layer is thinner than 0.6 µm, the lamination impact alleviating layer may not alleviate the impact in a sufficient manner, depending on the material of the lamination impact alleviating layer. In other words, there is a possibility that the organic EL layer is scratched or cracked at the time of lamination.

The aforementioned flexible film is preferably a film on which a gas-barrier layer having gas-barrier property has been formed. An organic EL layer and an electrode layer tend to be significantly deteriorated by the action of moisture and oxygen and, as a result, the product life thereof is significantly shortened. Accordingly, when a film is used, it is preferable that the film itself is provided with gas-barrier property.

The material by which the aforementioned lamination impact alleviating layer is formed is preferably selected from the group consisting of a metal, a metal oxide and a polymeric resin. In the present invention, the material of the lamination impact alleviating layer is preferably a material which hardly generates a gas and thus needs to be a material which allows film formation without using a solvent. Examples of such a material include the above-mentioned materials.

The aforementioned lamination impact alleviating layer preferably includes a moisture absorbent. An organic EL layer and an electrode layer tend to be significantly deteriorated by the action of moisture. Therefore, by making the lamination impact alleviating layer formed on the second electrode layer include a moisture absorbent, the second electrode layer can be protected from being deteriorated by the action of moisture, whereby the product life of the EL element can be prolonged.

The aforementioned lamination impact alleviating layer is preferably formed by the same material as an adhesive layer. In the present invention, as the sealing base material is a flexible film, the sealing base material needs to be attached to the substrate with an adhesive (i.e., by way of an adhesive layer), for sealing. By using the same material for the adhesive layer and the lamination impact alleviating layer, the process of forming these layers can be made simpler.

The present invention provides a method of producing the aforementioned EL element, comprising the processes of: coating the material for the lamination impact alleviating layer and the adhesive layer, on the sealing base material and the second electrode layer, and curing the material coated on the second electrode layer first, to form the lamination impact alleviating layer; and thereafter laminating the sealing base material with the substrate and then curing the material coated on the sealing base material, to form the adhesive layer.

When the adhesive layer and the lamination impact alleviating layer are made of the same material, it is necessary that the lamination impact alleviating layer has already been cured at the time of laminating the adhesive layer (on the sealing base material) with the substrate, Therefore, when the same material is used for the lamination impact alleviating layer and the adhesive layer, it is necessary that the lamination impact alleviating layer is first cured before effecting lamination and the adhesive layer is cured after lamination has been effected.

DETAILED DESCRIPTION OF THE PREFERRED EMBODIMENT

Figure 1:
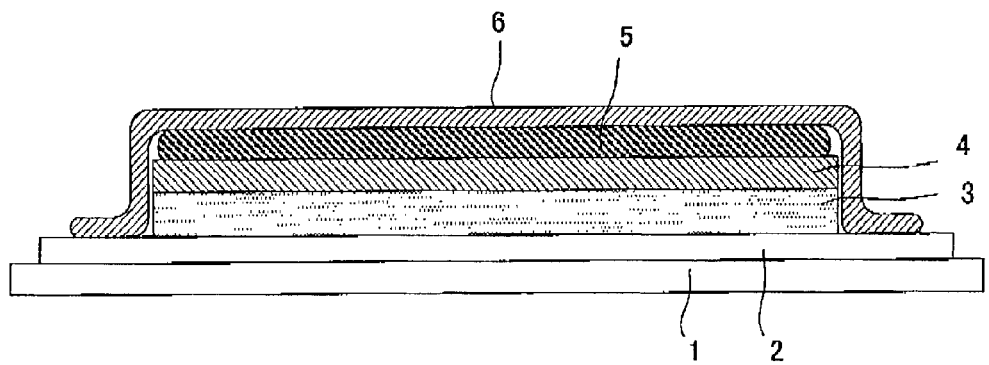
FIG. 1 is a schematic sectional view showing one example of an EL element of the present invention.

Hereinafter, an electroluminescent (EL) element of the present invention will be described in detail. FIG. 1 shows one example of the EL element of the present invention. In this example, a first electrode layer 2 is formed on a substrate 1. An organic EL layer 3 including at least a luminescent layer is formed on the first electrode 2. A second electrode layer 4 is formed on the organic EL layer 3. A lamination impact alleviating layer 5 is formed on the second electrode layer 4. The first electrode layer 2, the organic EL layer 3, the second electrode layer 4 and the lamination impact alleviating layer 5 are covered with a sealing base material 6 as a flexible film and sealed by the sealing base material.

In the present invention, when the substrate 1 in which the first electrode layer 2, the organic EL layer 3, the second electrode layer 4 and the lamination impact alleviating layer 5 are laminated in this order is attached or pasted to the sealing base material 6 at a predetermined pressure, even if there exist some irregularities (i.e., projections and/or dents) at the surface of a roll which applies the pressure to the sealing base material 6 and the substrate 1, substantially no stress is applied to the organic EL layer 3 because the lamination impact alleviating layer 5 exists on the second electrode layer 4, i.e., above the organic EL layer 3. Therefore, the organic EL layer 3 is unlikely to be scratched or cracked. Thus, an EL element of high quality which effects even luminescence can be obtained.

Each of the components constituting the EL element of the present invention will be described in detail hereinafter.

1. Lamination Impact Alleviating Layer

The critical characteristic of the present invention lies in that the lamination impact alleviating layer is formed on the second electrode layer, as described above.

In the present invention, the characteristic required of the lamination impact alleviating layer is to alleviate an impact and/or stress applied by a pressing member when a flexible film is pasted to the substrate for sealing. In order to block a stress, it is considered that providing a lamination impact alleviating layer having relatively high hardness and blocking stress applied from the pressing member by way of the film, with the lamination impact alleviating layer, will be effective. From this point of view, in the present invention, the hardness of the lamination impact alleviating layer is preferably no lower than 110 N/mm$^2$ when measured as a universal hardness value.

When the hardness of the lamination impact alleviating layer is lower than 110 N/mm$^2$, the lamination impact alleviating layer cannot alleviate a stress locally applied thereto during the lamination process and the organic EL layer is likely to be scratched and/or cracked.

The "universal hardness" employed in the present invention represents the average of four values measured by Fischer Scope H100V (a microhardness analizer) manufactured by Fischer Instruments K. K in the condition in which F=100, 000 mN/30 s.

The prescription of the measurement is as follows. A diamond indenter having a pyramidal shape whose angle formed at the top thereof between one face and another face opposite to the one face is 136° (Vickers indenter) is used as an indenter and the indentation depth under the test load is measured. The universal hardness value is expressed as a proportion obtained by dividing a test load by the surface area of the impression resulted from the test load (the surface area is calculated from the geometrical configuration of the indenter).

HU=Test load (N)/Surface area (mm$^2$) of Vickers indenter under Test load=F/26.43 h$^2$N/mm$^2$ (HU: Universal hardness value (N/mm$^2$), F: Test load (N), h; Indentation depth under Test load)

In the present invention, the film thickness of the lamination impact alleviating layer is preferably within a range of 0.6 to 100 μm, and more preferably within a range of 0.8 to 50 μm. When the lamination impact alleviating layer is thinner than 0.6 μm, the impact-alleviating capacity of the lamination impact alleviating layer at the time of lamination is deteriorated and the effect of preventing the organic EL layer from being scratched and/or cracked is reduced, which is not desirable. On the other hand, when the lamination impact alleviating layer is thicker than 100 μm, the film thickness of the resulting EL element is significantly increased, which is not desirable in consideration of the demand for a thinner EL element.

The material for forming the lamination impact alleviating layer of the present invention is preferably a material which does not generate a gas or the like which has an undesirable influence on the electrode layers and the organic EL layer in the lamination impact alleviating layer formation process.

Specific examples of the material for forming the lamination impact alleviating layer of the present invention include an organic compound such as a polymeric resin and an inorganic compound such as an inorganic oxide and a metal.

When the lamination impact alleviating layer is formed by an organic material, it is preferable that a polymeric resin is used. Here, a "polymeric resin" of the present invention represents a resin which is obtained by using a monomer or oligomer including a plurality of functional groups as a liquid coating solution and making the monomer or oligomer, which has been coated on a material, polymerize with each other to be cured. The "polymeric resin" of the present invention conceptually represents a two-pack-curing resin, a photo-curing resin, an electron beam-curing resin, a thermoset resin and the like.

The type of the polymeric resin used in the present invention is not particularly limited, as long as it can be applied in a form of a coating solution (preferably containing no solvent) and cured after being coated on the second electrode layer. Preferable examples of the resin include a two-pack-curing resin and a UV-curing resin.

Specifically, the two-pack-system epoxy resin (20X-325) manufactured by Three Bond Co., Ltd. or the like can be used.

Alternatively, an inorganic material such as an inorganic oxide, a metal or the like can be used for the material of the lamination impact alleviating layer. The lamination impact alleviating layer made of such an inorganic oxide can be formed by a method using a coating solution according what is called the "sol-gel" method or a method according to the vacuum film forming method. The lamination impact alleviating layer made of a metal can be formed by the vacuum film forming method.

Specific examples of the inorganic oxide which can be used in the present invention include $SiO_X$, $SiO_XN_Y$ or the like.

The type of the metal which can be used in the present invention is not particularly limited, as long as the metal can be vapor-deposited to form a film. For example, a metal of the same type as used for the second electrode layer is preferably used. In this case, there is no need to change the material for vapor deposition, which is advantageous in terms of making the whole production process efficient. Examples of such a metal include silver, aluminum and the like. In the present invention, it is particularly preferable to use silver.

The lamination impact alleviating layer of the present invention may contain a moisture absorbent so that the lamination impact alleviating layer also functions as a moisture absorbent layer. Examples of the moisture absorbent which can be added to the lamination impact alleviating layer include barium oxide, calcium oxide and the like. Alternatively, the lamination impact alleviating layer can be provided with the moisture absorbent function by vapor depositing a metal having moisture absorbent on the second electrode layer.

Further, the lamination impact alleviating layer of the present invention may be formed of the same material as the adhesive layer. By forming the lamination impact alleviating layer of the same material as the adhesive layer, the production process of the EL element can be simplified.

Figure 2:
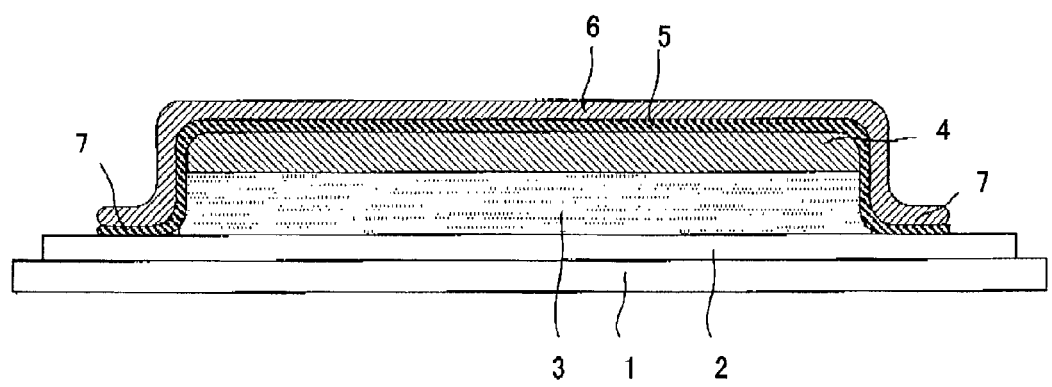
FIG. 2 is a schematic sectional view showing another example of the EL element of the present invention.

FIG. 2 shows another example of the EL element of the present invention, in which example the lamination impact alleviating layer and the adhesive layer are formed of the same material. In this example, a first electrode layer 2, an organic EL layer 3, a second electrode layer 4 are laminated in this order on a substrate 1, in a manner similar to the above-mentioned example of FIG. 1. However, in the present example of FIG. 2, an adhesive layer 7 is provided by coating on the entire inner surface of a sealing base material 6 as a flexible film. In this structure, the adhesive layer on the second electrode layer functions as the lamination impact alleviating layer 5.

In the present invention, when the lamination impact alleviating layer and the adhesive layer are formed of the same material, the above-mentioned polymeric resin can preferably be used as the material for the lamination impact alleviating layer and the adhesive layer. Specific examples of such a polymeric resin include a two-pack-curing resin and a UV-curing resin.

It should be noted that, in the production process in which the lamination impact alleviating layer and the adhesive layer are formed of the same material, only the material (a resin or the like) provided on the second electrode layer, i.e., only the portion which is to function as the lamination impact alleviating layer 5 is cured at first. Then, after the sealing base material 6 is laminated on the substrate 1, the entire portion of the adhesive layer is cured, whereby an EL element is produced.

Further, it is preferable that the lamination impact alleviating layer of the present invention has gas-barrier property. As the lamination impact alleviating layer is formed on the second electrode layer, it is desirable that the lamination impact alleviating layer is provided with a function of protecting the second electrode layer and the organic EL layer formed under the second electrode layer from oxygen and moisture.

From this point of view, it is preferable that a metal or an inorganic oxide layer formed by the vapor film forming method is combined with the lamination impact alleviating layer.

In the present invention, the lamination impact alleviating layer is basically formed all over the second electrode layer so that the lamination impact alleviating layer completely covers the area where the organic EL layer is formed under the second electrode layer. However, the present invention is not particularly limited to such a structure. For example, the lamination impact alleviating layer may be formed in a pattern-like configuration, as long as the lamination impact alleviating layer is formed so as not to transfer the impact at the time of lamination to the organic EL layer.

2. Sealing base material

In the present invention, a flexible film is used as the sealing base material. In the present invention, a "flexible film" represents a film having such flexibility as to allow the film to be pasted on a substrate by application of a predetermined pressure for sealing.

The film thickness of the flexible film used as the sealing base material in the present invention is normally within a range of 5 to 1000 μm, preferably within a range of 20 to 500 μm, and more preferably within a range of 200 to 400 μm. When the film is thicker than 1000 μm, the film is likely to lose flexibility and also makes the EL element itself thicker, running counter to the recent demand for a thinner EL element, which is not desirable. When the film is thinner than 5

μm, there may arise a problem in the strength of the film, depending on the type of the material constituting the film, which is not desirable, either.

The type of the material of the above-mentioned film is not particularly limited, as long as the material can be made into a film-like shape. Examples of the material include a film of polyethylene, polypropylene, polyethylene terephthalate, polymethyl methacrylate, polymethyl acrylate, polyester, polycarbonate, fluororesin, polyvinyl chloride, polyvinyl fluoride, polystyrene, ABS resin, polyamide, polyacetal, modified polyphenylene ether, polysulfone, polyarylate, polyether imide, polyether sultone, polyamide imide, polyimide, polyphenylene sulfide, liquid crystalline polyester, polybutylene terephthalate, polyethylene naphthalate, polymicroxylenedimethylen terephthalate, polyoxymethylene, polyether sulfone, polyether ether ketone, polyacrylate, acrylonitryl-styrene resin, phenol resin, urea resin, melamine resin, unsaturated polyester resin, epoxy resin, polyurethane, silicone resin, amorphous polyolefin, and an inorganic compound.

In the present invention, polyethylene terephthalate, polycarbonate and polyether sulfone are especially preferable for use among the above-mentioned materials.

In the present invention, it is preferable that the above-mentioned flexible film is further provided with a gas-barrier layer having gas-barrier property. The organic EL layer and the electrode layer tend to be significantly deteriorated by the action of moisture and oxygen and the product life thereof is significantly shortened. Thus, when a film is used, it is preferable that the film itself is provided with gas-barrier property. In the present invention, the film used as the sealing base material may itself have gas-barrier property. However, a film made of a resin generally exhibits poor gas-barrier property. Therefore, in the present invention, a structure in which a gas-barrier layer is formed on a film made of a resin is formed is preferably employed.

The type of the above-mentioned gas-barrier layer is not particularly limited, as long as the layer has gas-barrier property. The gas-barrier layer may be opaque, depending on the direction in which the organic EL layer emits light. The gas-barrier layer may be of either a single layer or a plurality of layers in a laminated state. Regarding the method of forming the gas-barrier layer, the gas-barrier layer may be formed by the wet-type (i.e., coating) method. However, in general, a gas-barrier layer formed by the vacuum film forming method is preferably used.

Preferable examples of the material constituting the barrier layer of the present invention include $SiO_X$, $SiO_XN_Y$ or the like.

In the present invention, a film made of a resin is generally employed. Therefore, when the gas-barrier layer is formed (in combination with the resin film), the heat resistance property of the resin film must be considered. In consideration of this, the gas-barrier layer is preferably a film formed by the plasma CVD method, and more preferably a silicon oxide or $SiO_XN_Y$ film formed by the plasma CVD method.

The gas-barrier property required of the above-mentioned gas-barrier film is not particularly limited, In general, the gas-barrier film preferably has the oxygen permeability equal or lower than $10^{-3}$ cc/m$^2$/day and moisture permeability equal or lower than $10^{-6}$ g/m$^2$/day.

Light generated by the organic EL layer is generally emitted on the side of the substrate. Therefore, normally, the sealing base material does not need to be transparent. However, when light generated by the organic EL layer is emitted on the side of the sealing base material, the sealing base material must be transparent. It should be noted, in this case, the lamination impact alleviating layer and the second electrode layer also need to be transparent.

3. Substrate

The type of the substrate used in the present invention is not particularly limited, as long as the substrate has sufficient strength to support the organic EL element. If the first electrode layer has sufficient strength, it is acceptable that the first electrode layer is formed so as to function also as a substrate.

The material of the substrate may be either a flexible material or a hard material, depending on the application. Specific example of thereof include glass, polyethylene, polypropylene, polyethylene terephthalate, polymethyl methacrylate, polymethyl acrylate, polyester, polycarbone and the like.

The material of the substrate needs to be or does not need to be transparent, depending on the direction in which light generated by the organic EL layer is emitted. In general, the substrate is preferably formed of a transparent material because it is normally preferable that light generated by the organic EL layer is emitted on the side of the substrate.

In the present invention, the substrate is preferably a flexible film. The sealing base material is a flexible film, as described above. Therefore, by using a flexible film as the substrate, the EL element as a whole can be constituted in a form of a flexible film. Such a flexible EL element as described above can be applied to various purposes, which is advantageous.

As the type of the flexible film which can be used for the substrate of the present invention is the same as that described with regards to the sealing base material, detailed description of the flexible film used for the substrate will be omitted. Further, as the feature that the substrate is preferably provided with a gas-barrier layer is also similar to the corresponding feature of the sealing base material described above, the description thereof will also be omitted.

The substrate may have either a separated sheet-like shape or a continuous shape. Examples of such shapes include a card-like, a film-like, a disc-like, a chip-like shapes.

4. First electrode layer and Second electrode layer

The first electrode layer and the second electrode layer formed on the substrate are formed, for example, by the methods of vacuum spattering, vacuum vapor deposition or applying a coating solution. The method of producing the first and second electrode layers are not particularly limited.

The first electrode layer used in the present invention needs to be transparent when light is emitted on the side of the substrate. On the contrary, when light is emitted on the side of the sealing base material, the second electrode layer needs to be transparent.

Either one of the first electrode layer and the second electrode layer may function as anode. Normally, the first electrode layer is formed as anode and the second electrode layer is formed as cathode. Examples of the material of the electrode layer formed as anode include metals of which work function is relatively large such as indium tin oxide (ITO), indium oxide and gold, conductive polymers such as polyaniline, polyacetylene, a polyalkylthiophen derivative and a polysilane derivative, and the like. Examples of the material of the electrode layer formed as cathode include metals or the like of which work function is relatively small, e.g., magnesium alloy such as MgAg, aluminum alloy such as AlLi, AlCa and AlMg, alkali metals and alkaline earth metals such as Li, Ca, and alloys of alkali metals and alkaline earth metals.

5. Organic EL layer

In the present invention, the organic EL layer is formed between the first electrode layer and the second electrode layer, as described above. The film thickness of the organic EL layer is generally within a range of 1 nm to 2 μm, preferably within in a range of 10 to 200 nm or so. Due to this thinness, the organic EL layer is vulnerable to scratches and/or cracks when the organic EL layer is laminated with the above-mentioned film-like sealing base material at a predetermined pressure, Therefore, the lamination impact alleviating layer, which is one of the features of the present invention, is necessitated.

The organic EL layer of the present invention is constituted of at least one organic layer including a luminescent layer. That is, the organic EL layer represents a layer or a plurality of layers including at least a luminescent layer, of which layer(s) is/are constituted of at least one organic layer. When the organic EL layer is formed by a wet-type method by coating, it is generally difficult to laminate a plurality of layers due to the reasons related to a solvent and the organic EL layer is normally constituted of one or two organic layers. However, it is possible to form the organic EL layer so as to be constituted of more than two organic layers by selecting appropriate organic materials and/or utilizing the vacuum vapor deposition method.

Examples of organic layers other than the luminescent layer formed inside the organic EL layer include a carrier injecting layer such as a positive hole injecting layer or an electron injecting layer, and a carrier transporting layer such as a positive hole transporting layer and an electron transporting layer. The carrier transporting layer, however, is generally eliminated by providing the carrier injecting layer with the function of transporting carriers. Other examples of organic layers formed inside the EL layer include a layer for preventing a positive hole or an electron from "jumping out" and thereby enhancing the reunion efficiency such as a carrier block layer.

Examples of the luminescent material used for the luminescent layer which is essential for the organic EL layer of the present invention include following materials:

a colorant-based luminescent material such as cyclopentadiene derivative, tetraphenyl butadiene derivative, triphenylamine derivative, oxadiazole derivative, pyrazoloquinoline derivative, distyrylbenzene derivative, distyrylarylene derivative, silol derivative, thiophene derivative, pyridine-ring compound, perynone derivative, perylene derivative, oligothiophene derivative, oxadiazole diner, and pyrazoline diner;

a metal complex-based luminescent material, which is, for example, a metal complex including a rare earth metal (such as Al, Zn, Be or the like or Tb, Eu, Dy or the like) as the core metal and oxadiazole, thiadiazole, phenylpridine, phenylbenzoimidazole, quinoline or the like as the ligand, such as aluminum-quinolinol complex, benzoquinolinol-beryllium complex, benzooxazole-zinc complex, benzothiazole-zinc complex, azomethyl-zinc complex, porphyrin-zinc complex, europium complex;

a polymer-based luminescent material such as polyparaphenylene vinylene derivative, polythiophene derivative, polyparaphenylene derivative, polysilane derivative, polyacetylene derivative, polyvinylcalbazole, polyfluorenone derivative, polyfluorene derivative, polyquinoxaline derivative and copolymers thereof.

A doping agent may be added to the above-mentioned luminescent layer, for the purpose of enhancing the light-emission efficiency, changing the wavelength of the generated light or the like. Examples of the doping agent include perylene derivative, coumalin derivative, rubrene derivative, quinacridone derivative, squalium derivative, porphyrin derivative, styryl derivative, tetracene derivative, pyrazoline derivative, decacyclene, phenoxazone, quinoxaline derivative, carbazole derivative, fluorene derivative and the like.

Examples of the material for forming the positive hole injecting layer include, in addition to the compounds exemplified as the luminescent materials for the luminescent layer, phenylamine; star-burst type amine; phthalocyanine; an oxide such as vanadium oxide, molybdenum oxide, ruthenium oxide, aluminumoxide; and a derivative of amorphous carbon, polyaniline, polythiophene or the like.

Examples of the material for forming the electron injecting layer include, in addition to the compounds exemplified as the luminescent materials for the luminescent layer, alkali metals, halides of alkali metals, and organic complexes of alkali metals such as aluminum, lithium fluoride, strontium, magnesium oxide, magnesium fluoride, strontium fluoride, calcium fluoride, barium fluoride, aluminum oxide, strontium oxide, calcium, sodium polymethylmethacrylatepolystyrene sulfonate, lithium, cesium, and cesium fluoride.

6. Adhesive layer

In the present invention, a flexible film is used as the sealing base material and therefore an adhesive layer is formed for adhering the sealing base material on the substrate for sealing. The adhesive layer may be formed in any one of the following manners in which: the adhesive layer is formed in a pattern-like configuration at a portion where the film-like sealing base material is in contact with the substrate; the adhesive layer is formed on the entire inner surface of the sealing base material, and the adhesive layer is formed only at the peripheral portions of the sealing base material.

Examples of the material used for the above-mentioned adhesive layer include epoxy-based resin (e.g., two-pack-system epoxy resin "20X-325" manufactured by Three Bond Co., Ltd.) or the like.

In the present invention, the lamination impact alleviating layer and the adhesive material may be formed of the same material, as described above. In this case, the above-mentioned specific materials for the lamination impact alleviating layer are also used for the adhesive material.

The adhesive layer can be formed according to the conventional methods. Examples of the formation method include a method of forming an adhesive layer on the entire surface by vacuum spattering, vacuum vapor deposition, spin coating, blade coating, bar coating or printing and a method of forming an adhesive layer in a pattern-like configuration by using a dispenser, an inkjet or by printing. The adhesive layer may be provided either on the sealing base material side or on the substrate side, by using the aforementioned methods.

7. Other Components

In the organic EL element of the present invention, members or components other than those described above, such as a protective layer formed on the second electrode layer or the like, may further be provided, depending on necessity.

The present invention is not limited to the embodiment described above. The above-mentioned embodiment is provided only for the exemplary purpose, and any modifications thereof having a structure and an effect substantially equivalent to the technological idea described in the accompanied claims of the present invention are included within the scope of the present invention.

For example, although the above-mentioned embodiment discloses an example in which the lamination impact alleviating layer is formed on the second electrode layer, the lamination impact alleviating layer may be formed between the substrate and the first electrode layer in an area corresponding to the area where the organic EL layer has been formed on the first electrode layer, if the substrate is constituted of a flexible film.

EXAMPLES

The present invention will be described further in detail by the following examples.

Example 1

A smooth substrate made of polyethylene terephthalate and provided with a barrier layer was washed and an indium tin oxide (ITO) electrode layer of which film thickness was 150 nm was formed thereon. Thereafter, the substrate having the ITO electrode layer thereon was washed by a UV radiation washer.

Next, on the ITO electrode (the anode electrode) formed as described above, a positive hole transporting layer of which thickness was 80 nm was formed, by spin coating, by using a solution in which poly 3,4-ethylenedioxythiophene/polystyrene sulfonate as a positive hole transporting material had been dispersed into water (FEDOT/PSS, the product name "Baytron PTPAI4083" manufactured by Bayer). Thereafter, the lamination was dried by heating for at least 1 hour in vacuum at 110° C.

Next, a mixture of:

| | |
|---|---|
| polyvinyl carbazole (manufactured by Anan Co., Ltd., Lot k81127) | 70 parts by weight; |
| an oxadiazole compound (manufactured by Wako Pure Chemical Industries, Ltd.) | 30 parts by weight; |
| coumalin 6 (manufactured by Aldrich, Chem. Co.) | 1 part by weight; and |
| xylene | 3367 parts by weight, | was coated on the positive hole transporting layer and the coating was shaped such that the thickness thereof was 60 nm, whereby a luminescent layer was formed.

Thereafter, on the luminescent layer formed as described above, Ca and Ag were vapor deposited at the deposition rate of 0.1 nm/second in the degree of vacuum of $1 \times 10^{-6}$ torr, whereby a cathode electrode of which thickness was 200 to 300 nm was formed.

On the lamination constituted of the anode electrode/the EL layer/the cathode electrode formed on the substrate, $SiO_2$ was applied by spattering such that the film thickness of $SiO_2$ was 0.6 μm.

Next, polyethylene terephthalate provided with a barrier layer was prepared as the sealing base material. The polyethylene terephthalate was washed by using a UV radiation washer. An epoxy-based resin which has gas-barrier property and thus hardly emits a gas (two-pack-system epoxy resin "20X-325" manufactured by Three Bond Co., Ltd.) was degassed by centrifuge defoaming, and the degassed resin was applied by spin coating on the polyethylene terephthalate film such that the film thickness of the resin layer was 5 μm. The polyethylene terephthalate as the sealing base material was then stacked on the $SiO_2$ layer at the portion corresponding to the EL element and pressingly attached thereto at the room temperature, for sealing. Thereafter, the resin was cured by heat, whereby an EL element was obtained.

Example 2

The lamination-constituted of the anode electrode/the EL layer/the cathode electrode, formed on the substrate, was prepared in a manner similar to that of example 1. An epoxy-based resin which forms a lamination impact alleviating layer and thus hardly emits a gas (two-pack-system epoxy resin "120X-325" manufactured by Three Bond Co., Ltd.) was degassed by centrifuge defoaming, and the degassed resin was applied by spin coating on the cathode electrode layer. The coated resin was then cured by heating such that the universal hardness value (HU) thereof was equal to 110 $N/mm^2$ (F=100 N/30 s), Next, a polyethylene terephthalate film provided with a barrier layer was prepared as the sealing base material. The polyethylene terephthalate film was washed by using a UV radiation washer. The same epoxy resin as was applied to the cathode electrode (two-pack-system epoxy resin "20X-325" manufactured by Three Bond Co., Ltd.) was degassed by centrifuge defoaming, and the degassed resin was applied by spin coating on the polyethylene terephthalate film such that the film thickness of the resin layer was 5 μm. The polyethylene terephthalate film as the sealing base material was then stacked on the lamination in an area including the portion corresponding to the EL element and pressingly attached to the lamination at the room temperature, for sealing.

Thereafter, the resin was cured at a temperature higher than the temperature in the formation process of the protective layer (the lamination impact alleviating layer), so that the resin became denser than that of the lamination impact alleviating layer, whereby an EL element was obtained.

Example 3

The lamination constituted of the anode electrode/the EL layer/the cathode electrode, formed on the substrate, was prepared in a manner similar to that of example 1. On the lamination, silver was vapor deposited by vacuum vapor deposition so that the film thickness of silver was 0.6 μm.

Next, a polyethylene terephthalate film provided with a barrier layer was prepared as the sealing base material. The polyethylene terephthalate film was washed by using a UV radiation washer. An epoxy-based resin which has gas-barrier property and thus hardly emits a gas (two-pack-system epoxy resin "20X-325" manufactured by Three Bond Co., Ltd.) was degassed by centrifuge defoaming, and the degassed resin was applied by spin coating on the polyethylene terephthalate film such that the film thickness of the resin layer was 5 μm. The polyethylene terephthalate film as the sealing base material was then stacked on the lamination in an area including the portion corresponding to the EL element and pressingly attached to the lamination at the room temperature, for sealing. Thereafter, the resin was cured by heating, whereby an EL element was obtained.

Evaluation

The elements obtained by examples 1 to 3 exhibited no short circuit, had no cracks, and achieved even luminescence.

Comparative Example 1

The lamination constituted of the anode electrode/the EL layer/the cathode electrode, formed on the substrate, was prepared in a manner similar to that of example 1.

Next, a polyethylene terephthalate film provided with a barrier layer was prepared as the sealing base material. The polyethylene terephthalate film was washed by using a UV radiation washer. An epoxy-based resin which has gas-barrier property and thus hardly emits a gas (two-pack-system epoxy resin "20X-325" manufactured by Three Bond Co., Ltd.) was degassed by centrifuge defoaming, and the degassed resin was applied by spin coating on the polyethylene terephthalate film such that the film thickness of the resin layer was 5 μm. The polyethylene terephthalate film as the sealing base material was then stacked on the lamination in an area including the portion corresponding to the EL element and pressingly attached to the lamination at the room temperature, for sealing. Thereafter, the resin was cured by heating, whereby an EL element was obtained. When a voltage was applied to the obtained element by an appropriate driving method, a crack was generated in the EL element and short-circuit occurred at the cracked portion. As a result, no luminescence was observed.

Comparative Example 2

The lamination constituted of the anode electrode/the EL layer/the cathode electrode, formed on the substrate, was prepared in a manner similar to that of example 1. An epoxy-based resin which has gas-barrier property and thus hardly emits a gas (two-pack-system epoxy resin "120X-325" manufactured by Three Bond Co., Ltd.) was degassed by centrifuge defoaming, and the degassed resin was applied by spin coating on the cathode electrode layer. The coated resin was then cured at a temperature lower than the curing temperature at example 2 such that the universal hardness value (HU) thereof was equal to 50 N/mm$^2$ (F=100 N/30 s).

Next, a polyethylene terephthalate film was prepared as the sealing base material. The polyethylene terephthalate film was washed by using a UV radiation washer. The same epoxy-based resin as was applied to the cathode electrode (two-pack-system epoxy resin "20X-325" manufactured by Three Bond Co., Ltd.) was degassed by centrifuge defoaming, and the degassed resin was applied by spin coating on the polyethylene terephthalate film such that the film thickness of the resin layer was 5 μm. The polyethylene terephthalate film as the sealing base material was then stacked on the lamination in an area including the portion corresponding to the EL element and pressingly attached to the lamination at the room temperature, for sealing. Thereafter, the resin was cured by heating, whereby an EL element was obtained. When a voltage was applied to the obtained element by an appropriate driving method, a crack was generated in the EL element and short-circuit occurred at the cracked portion. As a result, no luminescence was observed.

What is claimed is:

1. An electroluminescent element, comprising:
a substrate;
a first electrode layer formed on a surface of the substrate;
an organic electroluminescent layer formed on the first electrode layer, the organic electroluminescent layer including at least a luminescent layer;
a second electrode layer formed such that the organic electroluminescent layer is interposed between the first electrode layer and the second electrode layer; and
a sealing base material for sealing the first electrode layer, the organic electroluminescent layer and the second electrode layer,
wherein the sealing base material is a flexible film and
a lamination impact alleviating layer of which universal hardness value is no smaller than 110 N/mm$^2$ so as to prevent the organic electroluminescent layer from being scratched or cracked is formed on the second electrode layer, and
a material, by which the lamination impact alleviating layer is formed, is a two-pack-curing resin.

2. An electroluminescent element, comprising:
a substrate;
a first electrode layer formed on a surface of the substrate;
an organic electroluminescent layer formed on the first electrode layer, the organic electroluminescent layer including at least a luminescent layer;
a second electrode layer formed such that the organic electroluminescent layer is interposed between the first electrode layer and the second electrode layer; and
a sealing base material for sealing the first electrode layer, the organic electroluminescent layer and the second electrode layer,
wherein the substrate and the sealing base material are flexible films, respectively, and a lamination impact alleviating layer of which universal hardness value is no smaller than 110 N/mm$^2$ so as to prevent the organic electroluminescent layer from being scratched or cracked is formed on the second electrode layer, and
a material, by which the lamination impact alleviating layer is formed, is a two-pack-curing resin.

3. The electroluminescent element according to claim 1, wherein the lamination impact alleviating layer has film thickness which is no thinner than 0.6 μm.

4. The electroluminescent element according to claim 2, wherein the lamination impact alleviating layer has film thickness which is no thinner than 0.6 μm.

5. The electroluminescent element according to claim 1, wherein the sealing base material is a film on which a gas-barrier layer having gas-barrier property has been formed.

6. The electroluminescent element according to claim 2, wherein the substrate and the sealing base material are films on which a gas-barrier layer having gas-barrier property has been formed.

7. The electroluminescent element according to claim 1, wherein the lamination impact alleviating layer includes a moisture absorbent.

8. The electroluminescent element according to claim 2, wherein the lamination impact alleviating layer includes a moisture absorbent.

9. The electroluminescent element according to claim 1, wherein the lamination impact alleviating layer is formed by the same material as an adhesive layer.

10. The electroluminescent element according to claim 2, wherein the lamination impact alleviating layer is formed by the same material as an adhesive layer.

11. The electroluminescent element according to claim 1, wherein the lamination impact alleviating layer is formed by the different material as an adhesive layer.

12. A method of producing the electroluminescent element which is described in claim 9, comprising the processes of:
coating the material for the lamination impact alleviating layer and the adhesive layer, on the sealing base material and the second electrode layer, and curing the material coated on the second electrode layer first, to form the lamination impact alleviating layer; and
thereafter laminating the sealing base material with the substrate and then curing the material coated on the sealing base material, to form the adhesive layer.

* * * * *